United States Patent
Gu et al.

(10) Patent No.: US 8,456,202 B2
(45) Date of Patent: Jun. 4, 2013

(54) LATCH DIVIDER

(75) Inventors: Richard Gu, Plano, TX (US); Daquan Huang, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 88 days.

(21) Appl. No.: 13/028,003

(22) Filed: Feb. 15, 2011

(65) Prior Publication Data

US 2012/0206175 A1 Aug. 16, 2012

(51) Int. Cl.
*H03K 21/00* (2006.01)
*H03K 23/00* (2006.01)

(52) U.S. Cl.
USPC .......................................... 327/115; 327/117

(58) Field of Classification Search
None
See application file for complete search history.

(56) References Cited

U.S. PATENT DOCUMENTS

| | | | | |
|---|---|---|---|---|
| 6,525,571 | B2 * | 2/2003 | Green ............................ | 326/115 |
| 7,969,210 | B2 * | 6/2011 | Hosokawa et al. ............ | 327/117 |
| 2003/0048117 | A1 * | 3/2003 | Tung et al. .................... | 327/115 |
| 2005/0093587 | A1 * | 5/2005 | Knapp et al. .................. | 327/115 |
| 2006/0028225 | A1 | 2/2006 | von Appen | |
| 2007/0146022 | A1 * | 6/2007 | Inoue ............................ | 327/115 |
| 2007/0236267 | A1 | 10/2007 | Razavi et al. | |
| 2008/0191754 | A1 * | 8/2008 | Chang et al. .................. | 327/117 |
| 2008/0303561 | A1 | 12/2008 | Chu et al. | |
| 2010/0073040 | A1 | 3/2010 | Jo et al. | |
| 2011/0210767 | A1 * | 9/2011 | Chang et al. .................. | 327/118 |

FOREIGN PATENT DOCUMENTS

WO WO2009115865 9/2009

OTHER PUBLICATIONS

"A 75GHz PLL Front-End Integration in 65nm SOI CMOS Technology," IEEE Symposium on VLSI Circuits Digest of Technical Papers, 2007, pp. 174-175 (Daeik Kim ; Jonghae Kim ; Plouchart, J.-O. ; Choongyeun Cho ; Daihyun Lim ; Weipeng Li ; Trzcinski, R.).
"A 40-GHz frequency divider in 0.18-μm CMOS technology," IEEE J. of Solid State Circuits, vol. 39 No. 4, Apr. 2004, pp. 594-601 (Jri Lee ; Razavi, B.).
"A 20-GHz Phase-Locked Loop for 40Gb/s Serializing Transmitter in 0.13um CMOS," IEEE J. of Solid State Circuits, vol. 41, No. 4, Apr. 2006, pp. 899-908 (Jaeha Kim, Jeong-Kyoum Kim, Bong-Joon Lee, Namhoon Kim*, Deog-Kyoon Jeong, Wonchan Kim).
"A 0.18-μm CMOS 3.2-10 GHz Quadrature VCO for IEEE 802.15.4a UWB Transceivers," Asia Pacific Microwave Conference, Dec. 2009, pp. 245-248 (Yen Ju The, M. Annamalai Arasu, Yuan Gao, Yuanjin Zheng).
PCT Search Report mailed Sep. 25, 2012.

\* cited by examiner

*Primary Examiner* — Tuan T Lam
(74) *Attorney, Agent, or Firm* — Alan A. R. Cooper; Wade J. Brady, III; Frederick J. Telecky, Jr.

(57) ABSTRACT

There are numerous types of dividers that have been employed at various frequency ranges. For many very high frequency ranges (i.e., above 30 GHz), dividers in CMOS have been developed. However, many of these designs use multiple stages. Here, however, a single stage divider has been provided that is adapted to operate at very high frequencies (i.e., 120 GHz). To accomplish this, it uses parasitic capacitances in conjunction with inductor(s) to form an LC tanks so as to take advantages of parasitics that normal degrade performance.

21 Claims, 2 Drawing Sheets

LATCH DIVIDER

TECHNICAL FIELD

The invention relates generally to a divider and, more particularly, to a single stage latch divider.

BACKGROUND

There are numerous types of dividers that have been employed at various frequency ranges. For many very high frequency ranges (i.e., above 30 GHz), dividers in CMOS have been developed. However, many of these designs use multiple stages. When the frequency range of interest increases, though, these multi-stage divider arrangements can introduces parasitics (i.e., parasitic inductances) that can adversely affect performance. Thus, there is a need for a more compact divider that is adapted to operate at very high frequencies (i.e., 120 GHz).

Some examples of conventional circuits are PCT Publ. No. WO/2009115865; U.S. Patent Pre-Grant Publ. No. 2008/0303561; Kim et al., "A 75 GHz PLL Front-End Integration in 65 nm SOI CMOS Technology," 2007 *IEEE Symposium on VLSI Circuits Digest of Technical Papers*, pp. 174-175; Lee et al., "A 40-GHz Frequency Divider in 0.1-µm CMOS Technology," *IEEE J. of Solid State Circuits*, Vol. 39, No. 4, April 2004, pp. 594-601; Kim et al., "A 20-GHz Phase-Locked Loop for 40 Gb/s Serializing Transmitter in 0.13-µm CMOS," *IEEE J. of Solid State Circuits*, Vol. 41, No. 4, April 2006, pp. 899-908; and The et al., "A 0.18-µm CMOS 3.2-10 GHz Quadrature VCO of IEEE 802.15.4a UWB Transceivers," *Asia Pacific Microwave Conference*, 2009, December 2009, pp. 245-248.

SUMMARY

A preferred embodiment of the present invention, accordingly, provides an apparatus. The apparatus comprises an inductor; a plurality of sets of cross-coupled transistors, wherein each transistor from each set of cross-coupled transistors is coupled to the inductor; an input circuit that receives an input signal, that is coupled to each transistor from the sets of cross-coupled transistors, and that is coupled to the resonator, wherein the input signal has a first frequency; a control circuit that is coupled to the each transistor from at least one of the sets of cross-coupled transistors and that receives a control signal; and a plurality of output terminals, wherein each output terminal is coupled to the inductor, and wherein the output terminals provide an output signal having a second frequency, and wherein the second frequency is a fraction of the first frequency.

In accordance with a preferred embodiment of the present invention, the inductor has a center tap, wherein the center tap receives a supply voltage.

In accordance with a preferred embodiment of the present invention, the inductor further comprises: a first inductor that receives a supply voltage; and a second inductor that receives the supply voltage.

In accordance with a preferred embodiment of the present invention, the each set of cross-coupled transistors further comprises: a first transistor having a first passive electrode, a second passive electrode, and a control electrode; and a second transistor having a first passive electrode, a second passive electrode, and a control electrode, wherein the first passive electrode of the first transistor is coupled to the control electrode of the second transistor, and wherein the control electrode of the first transistor is coupled to the first passive electrode of the second transistor, and wherein the second passive electrode of the first transistor is coupled to the second passive electrode of the second transistor.

In accordance with a preferred embodiment of the present invention, the input circuit further comprises a third transistor having a first passive electrode, a second passive electrode, and a control electrode, and wherein the first passive electrode of the third transistor is coupled to the second passive electrodes of the first and second transistors from at least one of the sets of cross-coupled transistors, and wherein the control electrode of the third transistor receives at least a portion of the input signal.

In accordance with a preferred embodiment of the present invention, the control circuit further comprises a plurality of portions, wherein each portion is coupled to at least one transistor from at least one of the sets of cross-coupled further comprises: a fourth transistor having a first passive electrode, a second passive electrode, and a control electrode, wherein the control electrode of the fourth transistor receives the control signal; and a fifth transistor having a first passive electrode, a second passive electrode, and a control electrode, wherein the control electrode of the fifth transistor receives the control signal, and wherein the first passive electrode of the fifth transistor is coupled to the first passive electrode of the fourth transistor.

In accordance with a preferred embodiment of the present invention, an apparatus is provided. The apparatus comprises an LC resonator having: an inductor that receives a supply voltage; a first transistor having a first passive electrode, a second passive electrode, a control electrode, and a first parasitic capacitance, wherein the first passive electrode of the first transistor is coupled to the inductor; and a transistor having a first passive electrode, a second passive electrode, a control electrode, and a second parasitic capacitance, wherein the first passive electrode of the second transistor is coupled to the inductor, and wherein the second passive electrode of the first transistor is coupled to the second passive electrode of the first passive electrode, and wherein the first and second parasitic capacitances of the first and second transistors and the inductance of the inductor form an LC tank; a latch that is coupled to the control electrodes of the first and second transistors; an input circuit that receives an input signal, that is coupled to the latch, and that is coupled to the second passive electrodes of each of the first and second transistors, wherein the input signal has a first frequency; a control circuit that is coupled to the resonator and that receives a control signal; and a plurality of output terminals, wherein each output terminal is coupled to the resonator, and wherein the output terminals provide an output signal having a second frequency, and wherein the second frequency is a fraction of the first frequency.

In accordance with a preferred embodiment of the present invention, the latch further comprises: a third transistor having a first passive electrode, a second passive electrode, and a control electrode; and a fourth transistor having a first passive electrode, a second passive electrode, and a control electrode, wherein the first passive electrode of the third transistor is coupled to the control electrode of the fourth transistor, and wherein the control electrode of the third transistor is coupled to the first passive electrode of the fourth transistor, and wherein the second passive electrode of the third transistor is coupled to the second passive electrode of the fourth transistor.

In accordance with a preferred embodiment of the present invention, the input circuit further comprises a fifth transistor having a first passive electrode, a second passive electrode, and a control electrode, and wherein the first passive electrode of the fifth transistor is coupled to the second passive electrodes of the third and fourth transistors, and wherein the control electrode of the fifth transistor receives at least a portion of the input signal.

In accordance with a preferred embodiment of the present invention, the control circuit further comprises a plurality of portions, wherein each portion further comprises: a sixth transistor having a first passive electrode, a second passive electrode, and a control electrode, wherein the first passive electrode of the sixth transistor is coupled to the resonator, and wherein the control electrode of the sixth transistor receives the control signal; and a seventh transistor having a first passive electrode, a second passive electrode, and a control electrode, wherein the control electrode of the seventh transistor receives the control signal, and wherein the first passive electrode of the seventh transistor is coupled to the first passive electrode of the sixth transistor.

In accordance with a preferred embodiment of the present invention, an apparatus is provided. The apparatus comprises a input circuit having: a first NMOS transistor that receive a first portion of a differential input signal at its gate, wherein the differential input signal has a first frequency; and a second NMOS transistor that receives a second portion of the differential input signal at its gate; a latch that is coupled to the drain of the first NMOS transistor; a first output terminal that is coupled to the latch and that provides a first portion of a differential output signal, wherein the differential output signal has a second frequency, and wherein the second frequency is a fraction of the first frequency; a second output terminal that is coupled to the latch and that provides a second portion of the differential output signal; a LC resonator that is coupled to each of the first and second output terminals, wherein the LC resonator includes; an inductor that receives a supply voltage; and a plurality of MOS transistors that are coupled to the inductor and that each have a parasitic capacitance, wherein the parasitic capacitances of the plurality of MOS transistors and the inductance of the inductor form an LC tank; and a control circuit that is coupled to at least one of the plurality of MOS transistors and that receives a control signal.

In accordance with a preferred embodiment of the present invention, the inductor further comprises: a first inductor that receives a supply voltage and that is coupled to the first output terminal; and a second inductor that receives the supply voltage and that is coupled to the second output terminal.

In accordance with a preferred embodiment of the present invention, the latch further comprises: a third NMOS transistor that is coupled to the first output terminal at its drain, the second output terminal at its gate, and the drain of the first NMOS transistor at its source; and a fourth NMOS transistor that is coupled to the second output terminal at its drain, the first output terminal at its gate, and the drain of the first NMOS transistor at its source.

In accordance with a preferred embodiment of the present invention, plurality of MOS transistors further comprises: a fifth NMOS transistor that is coupled to the first output terminal at its drain, the second output terminal at its gate, the drain of the second NMOS transistor at its source, and the second output terminal at its gate; a sixth NMOS transistor that is coupled to the second output terminal at its drain, the first output terminal at its gate, and the drain of the second NMOS transistor at its source, and the first output terminal at its gate; a seventh NMOS transistor that is coupled to the first output terminal at its drain, the second output terminal at its gate, and the drain of the second NMOS transistor at its source; and an eighth NMOS transistor that is coupled to the second output terminal at its drain, the first output terminal at its gate, and the drain of the second NMOS transistor at its source.

In accordance with a preferred embodiment of the present invention, the control circuit further comprises a first portion and a second portion, and wherein the first portion of the control circuit includes: a PMOS transistor that is coupled to the second output terminal at its source, the gate of the seventh NMOS transistor at its drain, and that receives the control signal at its gate and the supply voltage at its body; and a ninth NMOS transistor that is coupled to the gate of the seventh NMOS transistor at its drain and that receives the control signal at its gate.

In accordance with a preferred embodiment of the present invention, the PMOS transistor further comprises a first PMOS transistor, and wherein the second portion of the control circuit further comprises: a second PMOS transistor that is coupled to the first output terminal at its source, the gate of the eighth NMOS transistor at its drain, and that receives the control signal at its gate and the supply voltage at its body; and a tenth NMOS transistor that is coupled to the gate of the eighth NMOS transistor at its drain and that receives the control signal at its gate.

In accordance with a preferred embodiment of the present invention, the first frequency is about 120 GHz.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
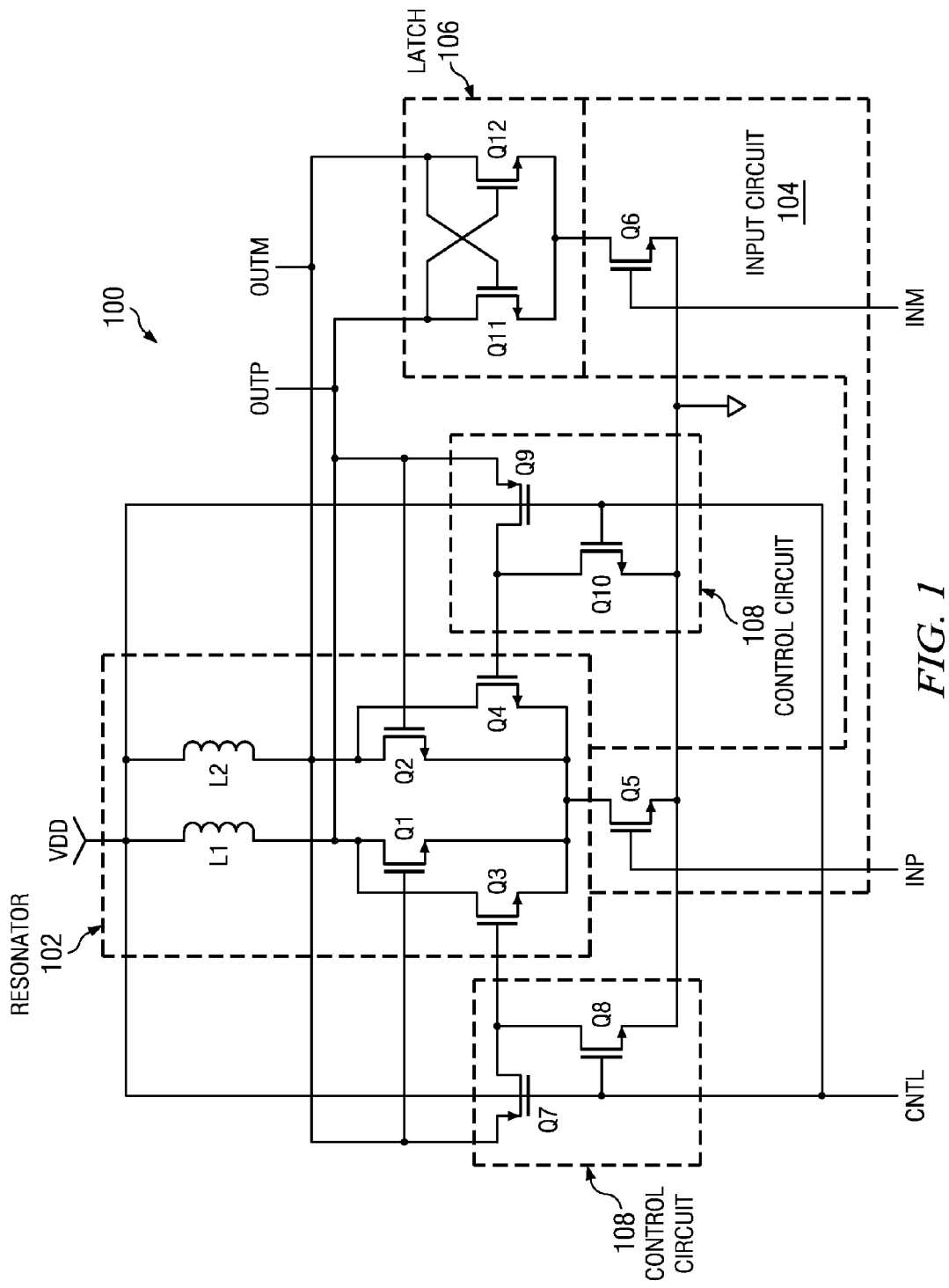
FIG. 1 is a diagram of an example of a latch divider in accordance with a preferred embodiment of the present invention.

Refer now to the drawings wherein depicted elements are, for the sake of clarity, not necessarily shown to scale and wherein like or similar elements are designated by the same reference numeral through the several views.

Referring to FIG. 1 of the drawings, the reference numeral 100 generally designates a latch divider in accordance with a preferred embodiment of the present invention. The divider 100 generally comprises a LC resonator 102, an input circuit 104, and a control circuit 108. The resonator 102 generally comprises inductors L1 and L2 that are coupled to output terminals (which provide output signals OUTP and OUTM) and that receive an supply voltage VDD; alternatively, inductors L1 and L2 can be replaced with a single inductor having a center tap that receives the supply voltage VDD. The resonator 102 and latch 104 each includes a pair of cross-coupled transistors Q1/Q2 and Q11/Q12, respectively (which can, for example be NMOS transistors). The input circuit 108 generally comprises transistors Q5 and Q6 (which can, for example, be NMOS transistors) that are each coupled to one of the latch 104 and resonator 102. The control circuit 110 generally includes two portions that respectively include transistors Q7 and Q8 and transistors Q9 and Q10. Transistors Q5, Q6, Q8, and Q10 can also, for example, be NMOS transistors, while transistors Q7 and Q9 can, for example, be PMOS transistors.

In operation, a differential input signal INP and INM (which can, for example, have a frequency of about 120 GHz) can be divided by divider 100 to a differential output signal OUTP and OUTM so as to have a frequency that is a fraction of the frequency of the differential input signal (i.e., one-half). Typically, the LC resonator 102 uses the parasitic capacitances from the gates of transistors Q1 and Q2 and the inductances of inductors L1 and L2 as an LC tank. Additionally, to tune the LC tank so as to extend the division frequency range, the control signal CNTL can be asserted to turn on transistors Q3 and Q4 (which also have parasitic capacitances that are substantially in parallel to parasitic capacitances of transistors Q3 and Q4). This LC tank operates in conjunction with latch 104 like a voltage controlled oscillator. The gates (or control electrodes) of transistors Q9 and Q10 receive the differential input signal INP and INM so that input circuit 102 can operate as a transconductance circuit, and the corresponding output signals from this transconductance circuit assist in controlling the latch 104 and resonator 102.

Figure 2:
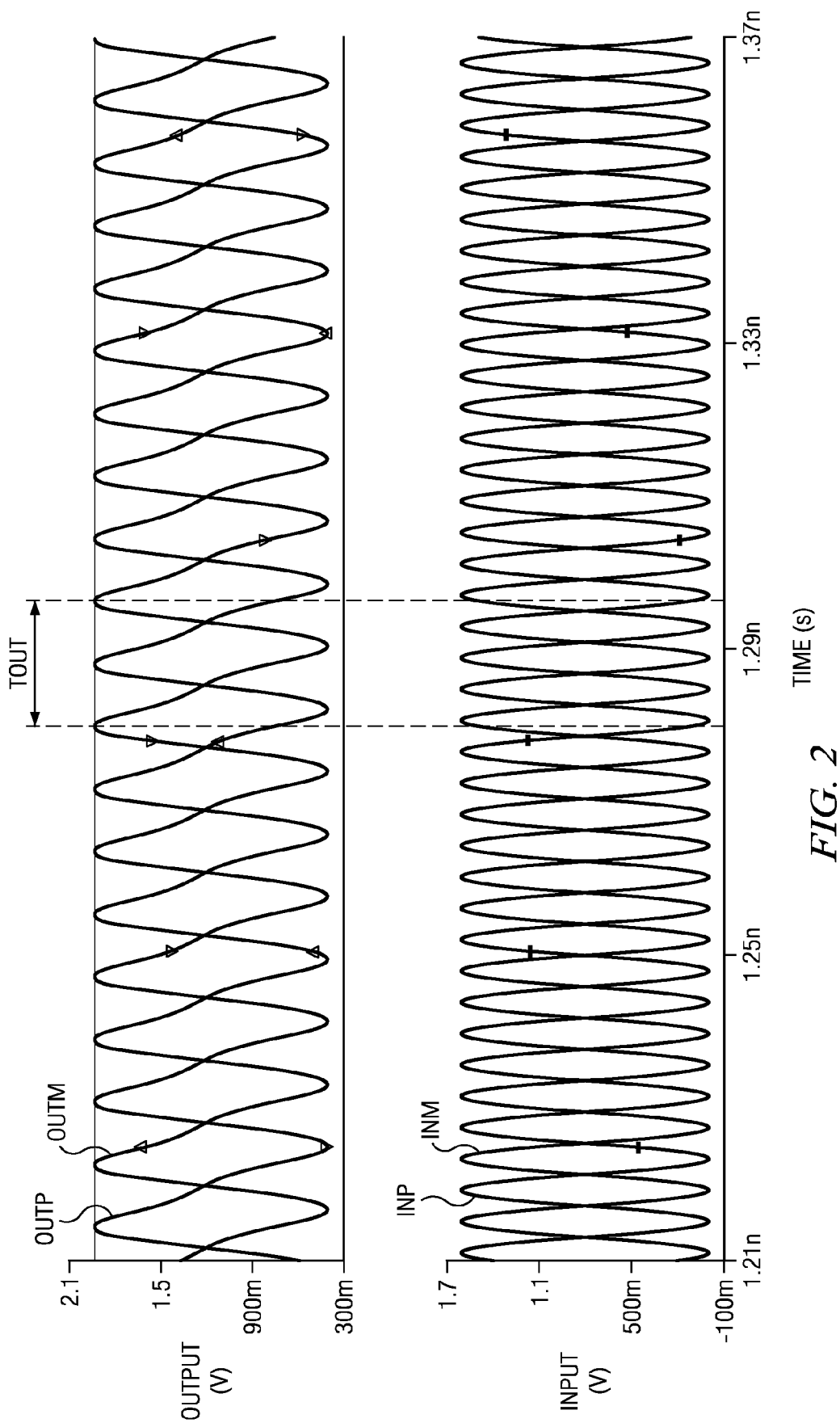
FIG. 2 is a diagram depicting the performance of the latch divider of FIG. 1.

Turning to FIG. 2, diagrams depicting the operation of the divider 100 can be seen. As shown, a differential input signal INP and INM (which is sinusoidal and which has a frequency of about 120 GHz) is provided. The differential output signal OUTP and OUTM (which is substantially sinusoidal) has a period TOUT which is approximately double the period for the input signal INP and INM, indicating that the division ratio for divider 100 is about one-half.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
an inductor;
a plurality of sets of cross-coupled transistors, wherein each transistor from each set of cross-coupled transistors is coupled to the inductor;
an input circuit that is configured to receive an input signal, that is coupled to each transistor from the sets of cross-coupled transistors, wherein the input signal has a first frequency;
a control circuit having a plurality of portions, wherein each portion is coupled to at least one transistor from at least one of the sets of cross-coupled, and wherein each portion includes:
a first transistor having a first passive electrode, a second passive electrode, and a control electrode, wherein the control electrode of the first transistor is configured to receive a control signal; and
a second transistor having a first passive electrode, a second passive electrode, and a control electrode, wherein the control electrode of the second transistor is configured to receive the control signal, and wherein the first passive electrode of the second transistor is coupled to the first passive electrode of the first transistor; and
a plurality of output terminals, wherein each output terminal is coupled to the inductor, and wherein the output terminals are configured to provide an output signal having a second frequency, and wherein the second frequency is a fraction of the first frequency.

2. The apparatus of claim 1, wherein the inductor has a center tap, wherein the center tap is configured to receive a supply voltage.

3. The apparatus of claim 1, wherein the inductor further comprises:
a first inductor that is configured to receive a supply voltage; and
a second inductor that is configured to receive the supply voltage.

4. The apparatus of claim 3, wherein the each set of cross-coupled transistors further comprises:
a third transistor having a first passive electrode, a second passive electrode, and a control electrode; and
a fourth transistor having a first passive electrode, a second passive electrode, and a control electrode, wherein the first passive electrode of the third transistor is coupled to the control electrode of the fourth transistor, and wherein the control electrode of the third transistor is coupled to the first passive electrode of the fourth transistor, and wherein the second passive electrode of the third transistor is coupled to the second passive electrode of the fourth transistor.

5. The apparatus of claim 4, wherein the input circuit further comprises a fifth transistor having a first passive electrode, a second passive electrode, and a control electrode, and wherein the first passive electrode of the fifth transistor is coupled to the second passive electrodes of the third and fourth transistors from at least one of the sets of cross-coupled transistors, and wherein the control electrode of the fifth transistor is configured to receive at least a portion of the input signal.

6. An apparatus comprising:
an LC resonator having:
an inductor that is configured to receive a supply voltage;
a first transistor having a first passive electrode, a second passive electrode, a control electrode, and a first parasitic capacitance, wherein the first passive electrode of the first transistor is coupled to the inductor; and
a second transistor having a first passive electrode, a second passive electrode, a control electrode, and a second parasitic capacitance, wherein the first passive electrode of the second transistor is coupled to the inductor, and wherein the second passive electrode of the first transistor is coupled to the second passive electrode of the second transistor, and wherein the first and second parasitic capacitances of the first and second transistors and the inductance of the inductor form an LC tank;
a latch that is coupled to the control electrodes of the first and second transistors;
an input circuit that is configured to receive an input signal, that is coupled to the latch, and that is coupled to the second passive electrodes of each of the first and second transistors, wherein the input signal has a first frequency;

a control circuit that is coupled to the LC resonator and that is configured to receive a control signal, wherein the control circuit has a plurality of portions, wherein each portion includes:

a third transistor having a first passive electrode, a second passive electrode, and a control electrode, wherein the first passive electrode of the third transistor is coupled to the LC resonator, and wherein the control electrode of the third transistor is configured to receive the control signal; and a fourth transistor having a first passive electrode, a second passive electrode, and a control electrode, wherein the control electrode of the fourth transistor is configured to receive the control signal, and wherein the first passive electrode of the fourth transistor is coupled to the first passive electrode of the third transistor; and a plurality of output terminals, wherein each output terminal is coupled to the LC resonator, and wherein the output terminals provide an output signal having a second frequency, and wherein the second frequency is a fraction of the first frequency.

7. The apparatus of claim 6, wherein the inductor has a center tap, and wherein the center tap is configured to receive the supply voltage.

8. The apparatus of claim 6, wherein the inductor further comprises:

a first inductor that is configured to receive the supply voltage; and a second inductor that is configured to receive the supply voltage.

9. The apparatus of claim 8, wherein the latch further comprises:

a fifth transistor having a first passive electrode, a second passive electrode, and a control electrode; and a sixth transistor having a first passive electrode, a second passive electrode, and a control electrode, wherein the first passive electrode of the fifth transistor is coupled to the control electrode of the sixth transistor, and wherein the control electrode of the fifth transistor is coupled to the first passive electrode of the sixth transistor, and wherein the second passive electrode of the fifth transistor is coupled to the second passive electrode of the sixth transistor.

10. The apparatus of claim 9, wherein the input circuit further comprises a seventh transistor having a first passive electrode, a second passive electrode, and a control electrode, and wherein the first passive electrode of the seventh transistor is coupled to the second passive electrodes of the fifth and sixth transistors, and wherein the control electrode of the seventh transistor is configured to receive at least a portion of the input signal.

11. An apparatus comprising:

a input circuit having:

a first NMOS transistor that receive a first portion of a differential input signal at its gate, wherein the differential input signal has a first frequency; and a second NMOS transistor that is configured to receive a second portion of the differential input signal at its gate;

a latch that is coupled to the drain of the first NMOS transistor;

a first output terminal that is coupled to the latch and that provides a first portion of a differential output signal, wherein the differential output signal has a second frequency, and wherein the second frequency is a fraction of the first frequency;

a second output terminal that is coupled to the latch and that provides a second portion of the differential output signal;

a LC resonator that is coupled to each of the first and second output terminals, wherein the LC resonator includes:

an inductor that is configured to receive a supply voltage; and a plurality of resonator MOS transistors that are coupled to the inductor and that each have a parasitic capacitance, wherein the parasitic capacitances of the plurality of resonator MOS transistors and the inductance of the inductor form an LC tank; and a control circuit having a first portion and a second portion, wherein each of the first and second portions of the control circuit includes:

a first controller MOS transistor that is coupled to the at least one of the first and second output terminal at its source, the gate of at least one of the plurality of resonator MOS transistors at its drain, and that is configured to receive a control signal at its gate and the supply voltage at its body; and a second controller MOS transistor that is coupled to drain of the first controller MOS transistor at its drain and that is configured to receive the control signal at its gate.

12. The apparatus of claim 11, wherein the inductor further comprises:

a first inductor that is configured to receive a supply voltage and that is coupled to the first output terminal; and a second inductor that is configured to receive the supply voltage and that is coupled to the second output terminal.

13. The apparatus of claim 12, wherein the latch further comprises:

a third NMOS transistor that is coupled to the first output terminal at its drain, the second output terminal at its gate, and the drain of the first NMOS transistor at its source; and a fourth NMOS transistor that is coupled to the second output terminal at its drain, the first output terminal at its gate, and the drain of the first NMOS transistor at its source.

14. The apparatus of claim 13, wherein plurality of resonator MOS transistors further comprises:

a fifth NMOS transistor that is coupled to the first output terminal at its drain, the second output terminal at its gate, and the drain of the second NMOS transistor at its source;

a sixth NMOS transistor that is coupled to the second output terminal at its drain, the first output terminal at its gate, and the drain of the second NMOS transistor at its source;

a seventh NMOS transistor that is coupled to the first output terminal at its drain, the second output terminal at its gate, and the drain of the second NMOS transistor at its source; and an eighth NMOS transistor that is coupled to the second output terminal at its drain, the first output terminal at its gate, and the drain of the second NMOS transistor at its source.

15. The apparatus of claim 14, wherein the first and second MOS controller transistors from the first portion of the control circuit respectively comprise:

a PMOS transistor that is coupled to the second output terminal at its source, the gate of the seventh NMOS transistor at its drain, and that is configured to receive the control signal at its gate and the supply voltage at its body; and a ninth NMOS transistor that is coupled to the gate of the seventh NMOS transistor at its drain and that is configured to receive the control signal at its gate.

16. The apparatus of claim 15, wherein the PMOS transistor further comprises a first PMOS transistor, and wherein the first and second MOS controller transistors from the second portion of the control circuit respectively comprise:

a second PMOS transistor that is coupled to the first output terminal at its source, the gate of the eighth NMOS transistor at its drain, and that is configured to receive the control signal at its gate and the supply voltage at its body; and a tenth NMOS transistor that is coupled to the gate of the eighth NMOS transistor at its drain and that is configured to receive the control signal at its gate.

17. The apparatus of claim 16, wherein the first frequency is about 120 GHz.

18. An apparatus comprising:
a first input terminal;
a second input terminal;
a first output terminal;
a second output terminal;
a control terminal;
an input circuit that is coupled of the first and second input terminals;
a latch that is coupled to the input circuit, the first output terminal, and the second output terminal;
a resonator having:
an inductor that is coupled to the first and second output terminals;
a first pair of cross-coupled transistors that are coupled to the input circuit, the first output terminal, and the second output terminal;
a first MOS transistor that is coupled to the input circuit at its source and the first output terminal at its drain; and
a second MOS transistor that is coupled to the input circuit at its source and the second output terminal at its drain;
a control circuit having:
a third MOS transistor that is coupled between the second output terminal and the gate of the first MOS transistor and that is coupled to the control terminal at its gate;
a fourth MOS transistor that is coupled to the gate of the first MOS transistor and that is coupled to the control terminal at its gate;
a fifth MOS transistor that is coupled between the first output terminal and the gate of the second MOS transistor and that is coupled to the control terminal at its gate;
a sixth MOS transistor that is coupled to the gate of the second MOS transistor and that is coupled to the control terminal at its gate.

19. The apparatus of claim 18, wherein the first pair of cross-coupled transistors further comprises first and second NMOS transistors.

20. The apparatus of claim 19, wherein the inductor further comprises a plurality of inductors.

21. The apparatus of claim 19, wherein the first, second, fourth, and sixth MOS transistors further comprise third, fourth, fifth, and sixth NMOS transistors, and wherein the third and fifth MOS transistor further comprise first and second PMOS transistors.

* * * * *